(12) United States Patent
Fisch et al.

(10) Patent No.: US 9,230,814 B2
(45) Date of Patent: Jan. 5, 2016

(54) NON-VOLATILE MEMORY DEVICES HAVING VERTICAL DRAIN TO GATE CAPACITIVE COUPLING

(75) Inventors: David Edward Fisch, Pleasanton, CA (US); Michael Curtis Parris, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 13/284,783

(22) Filed: Oct. 28, 2011

(65) Prior Publication Data

US 2013/0107630 A1    May 2, 2013

(51) Int. Cl.
| | | |
|---|---|---|
| G11C 16/04 | (2006.01) |
| H01L 21/28 | (2006.01) |
| H01L 29/423 | (2006.01) |
| H01L 29/66 | (2006.01) |
| H01L 29/78 | (2006.01) |
| H01L 29/788 | (2006.01) |

(Continued)

(52) U.S. Cl.
CPC .... *H01L 21/28273* (2013.01); *H01L 27/11521* (2013.01); *H01L 29/4236* (2013.01); *H01L 29/42336* (2013.01); *H01L 29/42368* (2013.01); *H01L 29/66181* (2013.01); *H01L 29/66825* (2013.01); *H01L 29/785* (2013.01); *H01L 29/7881* (2013.01); *H01L 29/945* (2013.01); *H01L 27/11558* (2013.01); *H01L 29/7889* (2013.01)

(58) Field of Classification Search
CPC ............ H01L 21/336; H01L 29/66825; H01L 29/788; H01L 29/42324; H01L 29/42336; H01L 27/11517; H01L 29/7841; H01L 27/10802; G11C 16/0408; G11C 2216/10; G11C 16/0441

USPC ................ 365/185.18, 185.26; 257/298, 315, 257/E29.3, E21.422
See application file for complete search history.

(56) References Cited

U.S. PATENT DOCUMENTS

| 5,501,996 A | 3/1996 | Yang et al. |
| 5,646,430 A | 7/1997 | Kaya et al. |
| 7,274,060 B2 | 9/2007 | Popp et al. |

(Continued)

FOREIGN PATENT DOCUMENTS

| EP | 1432039 A2 | 6/2004 |
| EP | 2346078 A1 | 7/2011 |
| WO | 2009086433 | 7/2009 |

OTHER PUBLICATIONS

PCT Application No. PCT/US2012/000527 Filed Oct. 29, 2012; International Search Report Issued Apr. 24, 2013.

(Continued)

*Primary Examiner* — Son Dinh
*Assistant Examiner* — Uyen B Tran

(57) ABSTRACT

Vertically fabricated non-volatile memory devices having capacitive coupling between a drain region and a floating gate. A two terminal programmable non-volatile device includes a floating gate disposed vertically about a substrate, wherein the floating gate comprises a first side, a second side, and a bottom portion. A source region is coupled to a first terminal and formed adjacent to the first side of the floating gate. A drain region is coupled to a second terminal and formed adjacent to the second side of the floating gate. The non-volatile device includes a channel coupling the source region and drain region for programming and erasing operations. The drain region is capacitively coupled to the floating gate.

30 Claims, 9 Drawing Sheets

(51) Int. Cl.
*H01L 27/115* (2006.01)
*H01L 29/94* (2006.01)

(56) References Cited

U.S. PATENT DOCUMENTS

| | | | |
|---|---|---|---|
| 7,508,027 B2 | 3/2009 | Oberhuber et al. | |
| 7,920,426 B2 | 4/2011 | Liu | |
| 2004/0056299 A1* | 3/2004 | Ding et al. | 257/315 |
| 2004/0109364 A1 | 6/2004 | Yang et al. | |
| 2004/0248371 A1* | 12/2004 | Wang | 438/330 |
| 2006/0284225 A1* | 12/2006 | Popp et al. | 257/296 |
| 2007/0158699 A1 | 7/2007 | Watanabe et al. | |
| 2008/0186772 A1* | 8/2008 | Horch | 365/185.18 |
| 2009/0122605 A1* | 5/2009 | Liu et al. | 365/185.03 |
| 2010/0078702 A1* | 4/2010 | Nakao | 257/321 |
| 2010/0155805 A1* | 6/2010 | Ozawa | 257/315 |
| 2010/0165698 A1 | 7/2010 | Liu | |
| 2011/0101440 A1 | 5/2011 | Cai et al. | |

OTHER PUBLICATIONS

PCT Application No. PCT/US2012/000527 Filed Oct. 29, 2012; Written Opinion of the International Searching Authority Issued Apr. 24, 2013.

* cited by examiner

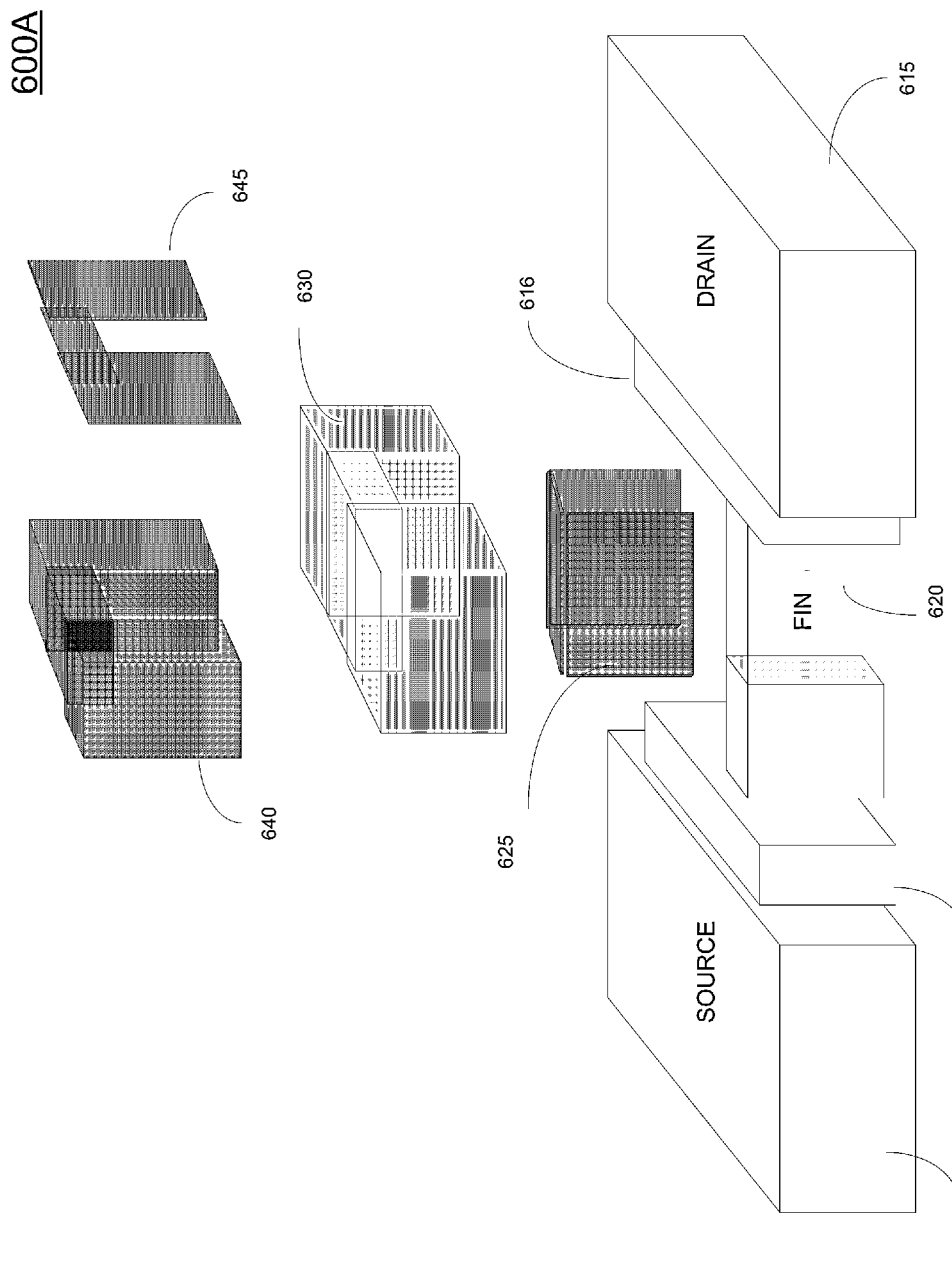

NON-VOLATILE MEMORY DEVICES HAVING VERTICAL DRAIN TO GATE CAPACITIVE COUPLING

RELATED APPLICATIONS

The present application is related to U.S. patent application Ser. No. 13/284,795, filed on Oct. 28, 2001, entitled "COMMON DOPED REGION WITH SEPARATE GATE CONTROL FOR A LOGIC COMPATIBLE NON-VOLATILE MEMORY CELL," naming David E. Fisch, William C. Plants, and Michael C. Parris as inventors. That application is incorporated herein by reference in its entirety and for all purposes.

BACKGROUND

One time programmable (OTP) and multi-time programmable (MTP) memories have been recently introduced for beneficial use in a number of applications where customization is required for both digital and analog designs. These applications include data encryption, reference trimming, manufacturing identification (ID), security ID, and many other applications. Incorporating OTP and MTP memories nonetheless typically comes at the expense of some additional processing steps.

For example, OTP and MTP memories may include flash memory devices that store data on an array of programmable memory cells. Typically, these cells are made from floating-gate metal oxide semiconductor field effect transistors (MOSFETs) that can be electrically erased and reprogrammed. PRIOR ART FIG. 1 illustrates a non-volatile floating gate MOSFET that is configured to store an electrical charge for extended periods of time without the presence of a power supply. The MOSFET 100 is shown as a planar structure where features are placed on the surface of a silicon wafer or substrate 110. As shown, the floating gate MOSFET includes a p-type substrate 110, a drain region 120 with n-type dopants, and a source region 125 with n-type dopants. A gate structure is disposed on top of the substrate, and includes a floating gate 150 that is isolated by the oxide layers 140 and 160. Because the floating gate 150 is electrically isolated, any electrons placed in this layer are trapped, and will remain trapped under normal conditions for many years. A control gate is also deposited over the floating gate 150 with an oxide layer 140 interposed therebetween. The control gate 130 is capacitively coupled to the floating gate 150 and is used to control the operation of the MOSFET 100.

Programming, erasing, and reading the MOSFET 100 is achieved by applying various voltages between the control gate, source region, and drain region in different combinations. For flash memory, these voltages are comparatively high, such as up to and exceeding 12 volts. For instance, when the MOSFET 100 is programmed, an n-type channel 115 is formed between the drain region 120 and source region 125. During programming, electrons are injected through oxide 160, and subsequently trapped in the floating gate 150. When reading a programmed MOSFET 100, current does not flow through MOSFET 100, which indicates a logic-0. On the other hand, an erased MOSFET 100 does not have electrons present on the floating gate 150. As such, when reading an erased MOSFET 100, current flows through MOSFET 100, which indicates a logic-1.

Numerous steps are implemented to fabricate one or more MOSFETs 100 on a silicon wafer. These include various deposition, removal, patterning, and masking steps to grow the features of the MOSFET 100, including the drain and source regions, the floating gate oxide layer, and the control gate oxide layer. For a typical flash memory cell having a double polysilicon gate structure, it may take up to 20 masking steps. Each subsequent masking step will increase the fabrication cost and also degrade the quality of the transistors. As such, for embedded applications, the use of flash memory fabricated onto portions of the silicon chip may be too costly for the function provided, and may affect the quality of all the active transistors on the chip.

An effort has been made to planarize the memory cell by moving the control gate to the side of the active memory transistor. More particularly, the control gate includes an n-well built to the side that is capacitively coupled to the floating gate of the memory device. In some cases, the n-well is coupled to the drain of the device. Since the n-well is capacitively coupled to the floating gate, voltages applied to the drain will, in part, also be applied to the gate, effectively creating a two-terminal memory device. While this structure reduces the cost of fabricating the embedded memory chip, as it does not require double polysilicon gate layers, a disadvantage is that additional planar real estate on the surface of the chip is needed to build the control gate to the side of the active memory device.

As computing devices increasingly become more functionally complex, their dimensions are also becoming thinner and smaller, such as, in the case of hand-held devices. As a result, planar real estate on chips used within the device is at a premium. It would be advantageous to have memory devices that do not require additional masking steps for fabricating double polysilicon gate layers, while at the same time reduces the planar footprint of the memory device.

SUMMARY

Embodiments of the present invention provide for non-volatile memory devices that are programmable through vertical drain to gate capacitive coupling. For instance, methods and apparatus for vertically fabricated non-volatile memory devices having capacitive coupling between a drain region and a floating gate are described.

In one embodiment, a two terminal programmable non-volatile memory device includes a floating gate disposed vertically about a substrate. The floating gate comprises a first side, a second side, and a bottom portion. A source region is coupled to a first terminal and formed adjacent to the first side of the floating gate. A drain region is coupled to a second terminal and is formed adjacent to the second side of the floating gate. The non-volatile memory device includes a channel that couples the source and drain regions for programming, reading, and erasing operations. The drain region is capacitively coupled to the floating gate.

In another embodiment a memory cell array also exploits the vertical drain to gate coupling to enhance the programming of one or more floating gate memory cells. The array includes a plurality of bit lines, each of which is oriented in a first direction. The memory array also includes a plurality of two terminal programmable non-volatile devices. Each of the devices includes a recessed channel floating gate that is partially embedded in a substrate. The floating gate includes a first side, a second side, and a bottom portion. The device also includes a source region that is coupled to a first terminal. The source region is formed adjacent to the first side of the floating gate. A drain region is coupled to a second terminal. The drain region is formed adjacent to the second side of the floating gate. The drain region is electrically coupled to one of the bit lines via a bit line contact. A channel couples the source region and drain region. More particularly, the drain region is capacitively coupled to the floating gate.

In another embodiment, a method for forming a memory cell array is disclosed. The method includes providing a semiconductor substrate having a surface. In the array, a plurality of two terminal programmable non-volatile devices is provided and formed about the surface. The plurality of devices is arranged in rows and columns to form the array. A plurality of floating gates of the non-volatile devices is also provided. Each of the floating gates is disposed vertically about the surface of the substrate. More particular, each of the floating gates includes a first side, a second side, and a bottom portion. A plurality of source regions is provided. Each of the source regions is formed adjacent to a corresponding first side of a corresponding floating gate. A plurality of drain regions is also provided. Each of the drain regions is formed adjacent to a corresponding second side of a corresponding floating gate. Also, each drain regions is capacitively coupled to a corresponding floating gate. A plurality of channels is also provided, wherein each channel couples a corresponding source region and a corresponding drain region of a corresponding non-volatile device.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

PRIOR ART

FIG. 6A is a blown up view of a two-terminal floating gate FinFET having capacitive coupling between a drain region and a floating gate, wherein the conducting channel is wrapped by a thin silicon fin forming the gate of the device, in accordance with one embodiment of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate a non-volatile memory device that exploits the vertical drain to gate coupling of vertically disposed devices. This memory device featuring drain to gate coupling is fabricated using less masking steps than a traditional flash memory device since there is no formation of double polysilicon gate layers. In addition, the non-volatile memory device featuring drain to gate coupling is able to perform operations at low voltages. Moreover, the memory device featuring drain to gate coupling exhibits a reduced planar footprint as there is no need to form a capacitor to the side of the active area.

Current memory devices are evolving to non-planar geometries and/or architectures over more conventional planar FET structures formed laterally on a substrate. For instance, dynamic random access memory (DRAM) processes have almost universally moved to recess-channel-array transistors (RCAT) structures in an effort to increase channel lengths to improve performance without consuming planar real estate on a substrate. One inherent problem with this technology is that it increases active to gate capacitance, which detrimentally increases source to drain leakage. Conventionally, process techniques are continually modified in an effort to reduce the capacitive coupling to the gate. On the other hand, embodiments of the present invention are configured to increase the capacitive coupling to the gate, and more particularly, to provide increased drain to gate capacitive coupling.

Figure 1:
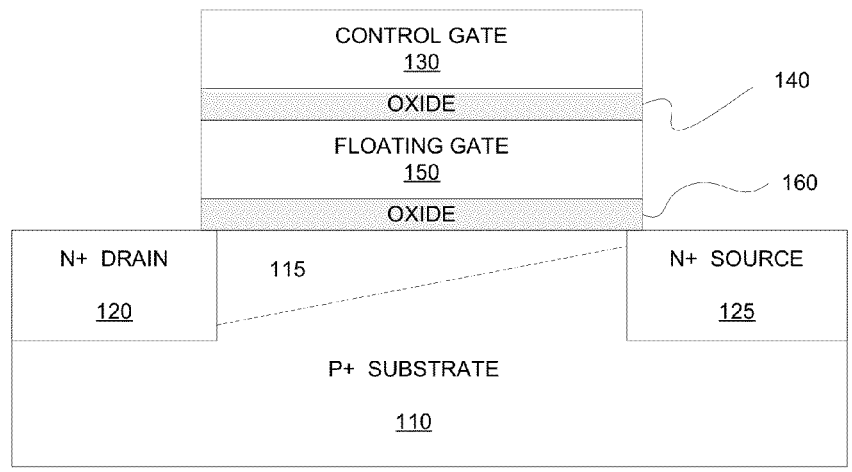
FIG. 1 is a cross section of a metal oxide field effect transistor (MOSFET).
Figure 2:
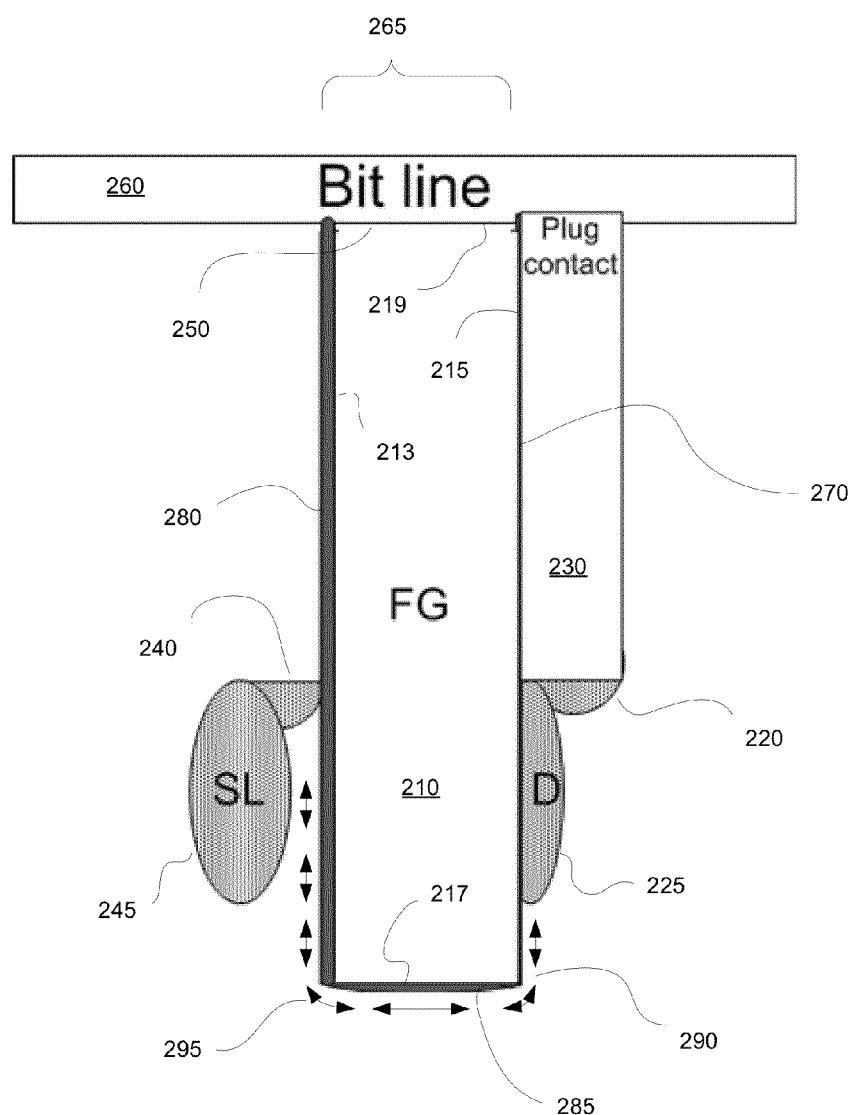
FIG. 2 is a cross-sectional view of an exemplary vertically disposed two-terminal floating gate field effect transistor (FET) having capacitive coupling between a drain region and a floating gate, in accordance with one embodiment of the present disclosure.

FIG. 2 is a cross-sectional view of an exemplary vertically disposed floating gate FET memory device 200 having capacitive coupling between a drain region and a floating gate, in accordance with one embodiment of the present disclosure. More specifically, the memory device 200 is a two-terminal non-volatile device that is operable as a one time programmable device, or a multiple time programmable device. In embodiments, the memory device 200 is formed using conventional transistor metal oxide semiconductor techniques with appropriate modifications. As such, features shown in memory device 200 (e.g., source region, drain region, gate, etc.) comprise materials known to be suitable for use in the fabrication of FET memory devices.

The non-volatile memory device 200 includes a floating gate 210 disposed vertically about a substrate. The floating gate includes a first side 213, a second side 215, and a bottom portion 217. A top portion 219 is also shown for the floating gate. The material forming the floating gate is polysilicon, in one implementation, but can be any suitable material capable of storing charge. For instance, the floating gate may be comprised of a metal layer, a polysilicon layer, or any other suitably conducting material. In addition, the floating gate 210 is not electrically connected to a voltage source, but a voltage is applied to the gate 210 through capacitive coupling, as described below. While the floating gate is described and shown as a single polysilicon layer, other materials are supported in other embodiments of the present invention.

In one embodiment, the floating gate 210 is configured as a recessed channel, and is partially embedded in the substrate (not shown). In that manner, memory device 200 is configured as a vertical structure. While FIG. 2 depicts the non-volatile memory in a RCAT configuration, it will be apparent to those skilled in the art that other vertical structures can be used. Thus, embodiments of the present invention can be used in multi-gate (FinFET type) orientations, or in any configuration wherein the floating gate is oriented vertically with respect to the substrate.

A source region 240 is formed adjacent to the first side 213 of the floating gate 210. In one embodiment, the spacing between the active source region 240 and the floating gate 210 is increased to reduce capacitive coupling. As shown in FIG. 2, a spacer gate oxide 280 is formed between the source region 240 and the floating gate 210. That is, the spacer gate oxide 280 is disposed on the first side 213 of the floating gate 210. In that manner, the source region 240 is electrically isolated from the floating gate 210, and further is of a thickness necessary to reduce or eliminate capacitive coupling between the source region 240 and the floating gate 210.

In other embodiments, a spacer gate oxide 285 is formed adjacent to the bottom portion 217 of the floating gate 210. Spacer gate oxide 285 may be formed using the same processing step or steps used to fabricate spacer gate oxide 280 in one embodiment, or may be formed using different fabrication step or steps.

The source region 240 is coupled to a first terminal (not shown) through which a voltage is applied. In one implementation, the first terminal is coupled to a bit or source line 245 coupled to the source region 240. For instance, the terminal may be coupled to any point in the source line 245 (e.g., midpoint, end, etc.). In another implementation, the first terminal is coupled directly to the source region 240. For instance, the source region may be formed using a channel and the first terminal is coupled to any point in the channel. In some embodiments, the source line 245 implant is configured to minimize coupling to the floating gate 210. For instance, the depth of the source line 245 is configured (e.g., shortened, deepened, increase spacing, etc.) to minimize coupling between the floating gate 210 and the source line 245.

An effective drain junction is shown for the non-volatile memory device 200. The drain junction includes the drain region 220, the drain extension 225, the plug contact 230, and portions of the bit line 260. The effective drain is defined as those features in the non-volatile memory device that are configured for capacitive coupling with the floating gate 210.

In particular, the drain region 220 is formed adjacent to the second side 215 of the floating gate 210. The drain region 220 overlaps a sufficient portion of the floating gate 210 such that a programming voltage for the non-volatile memory device that is applied to a terminal (not shown) of the drain region is imparted to the floating gate 210 through capacitive coupling. Thus, at a minimum, any voltage applied to the drain region 220 will be effectively coupled onto the floating gate 210.

In one embodiment, the drain region 220 includes the optional drain extension 225. In this manner, the drain region 220 that includes extension 225 extends further into the substrate than a typical drain region 220. In embodiments, the depth of the drain extension 225 is of varying lengths. For instance, the drain extension 225 may extend as far as the bottom portion 217 of the floating gate 210. In other embodiments, drain extension 225 extends part way down side 215 of the floating gate 210. In another embodiment, drain extension 225 follows the contour of the bottom portion 217 of floating gate 210, such that drain extension is formed adjacent to side 215, bottom portion 217, and partly up side 213 towards the source region 240. In other words, the drain extension 225 wraps around the bottom of the floating gate 210 adjacent to sides 213 and 215 and bottom portion 217. As shown, the drain extension 225 extends further into a corresponding substrate than the source region 240, such that the drain region 220, that includes drain extension 225, is exposed to more of the floating gate 210 than the exposure between the source region 240 and the floating gate 210. That is, an overlap between the drain region 220 to floating gate 210 is greater than an overlap between the source region 240 to floating gate 210. Additionally, drain region 220 is electrically coupled to the plug contact 230, wherein contact 230 provides electrical conductivity to the bit line 260. One or more of these features is configurable with the drain region 220 in combination to form the drain junction, wherein the drain junction provides an effective capacitive coupling to the floating gate 210. Thus, any voltage applied to the drain junction will be effectively coupled onto the floating gate 210.

Also, a portion 265 of the bit line 260 is also included in the drain junction, in one embodiment. As shown, the bit line 265 is formed adjacent to the top portion 219 of the floating gate 210. More specifically, portion 265 of the bit line 260 is formed adjacent to the top portion 210 of the floating gate 210. A high dielectric constant (k) oxide layer 250 separates the bit line 260 from the floating gate 210. In this implementation, the portion 265 is also included in the drain junction, as portion 265 is also capacitively coupled to the floating gate 210 through the top portion 219. That is, any voltage applied to the bit line 260, is also effectively applied to portion 265 of the bit line 260, that is also included in the drain junction, and will be effectively coupled onto the floating gate 210.

As shown in FIG. 2, a thin gate oxide 270, with a high dielectric constant (k) characteristic, is formed between the drain region 220 and the floating gate 210. As shown in FIG. 2, the thin gate oxide 270 lines the second side 215 of the floating gate, in order to electrically isolate the gate 210 from any portion of the drain region 220 or any feature included in the drain junction that is electrically coupled to the drain region. For instance, thin gate oxide 270 is formed on the second side 215 of the floating gate and separates each of the bit line contact 230, the drain region 220 and the drain extension 225 from the floating gate 210.

More particularly, the thickness of the thin gate oxide 270 is sufficient to electrically isolate the drain. However, the thin gate oxide is also sufficiently thin to promote capacitive coupling between the drain region 220 and any other features that are electrically coupled to the drain region 220. As shown in FIG. 2, the thickness of the thin gate oxide 270 is thinner than that of the spacer gate oxide 280 that separates the source region 240 from the floating gate 210, and is thinner than the spacer gate oxide 285 disposed adjacent to the bottom portion 217 of the floating gate 210. In that manner, the capacitive coupling between the drain region 220 and the floating gate 210 is greater than any potential capacitive coupling between the source region 240 and the floating gate 210.

During operation, a channel 290 couples the source region 240 and the drain region 220. More specifically, channel 290 is formed between the source region 240 and the drain region 220 and/or drain extension 225. In that manner, current flow 295 is manipulated in the channel region 290 for purposes of injecting electrons into the floating gate 210, removing electrons from the floating gate, or for purposes of performing a read operation on the semiconductor device 200 as influenced by the charge on the floating gate 210.

In one embodiment, channel 290 is doped with p-type impurities, and source region 240 and drain region 220 are doped with n-type impurities, such that the two terminal non-volatile memory device 200 is an n-channel transistor. In other embodiments, channel 290 is doped with n-type impurities, and the source region 240 and drain region 220 are doped with p-type impurities, such that the two terminal non-volatile memory device 200 is a p-channel transistor.

Figure 3:
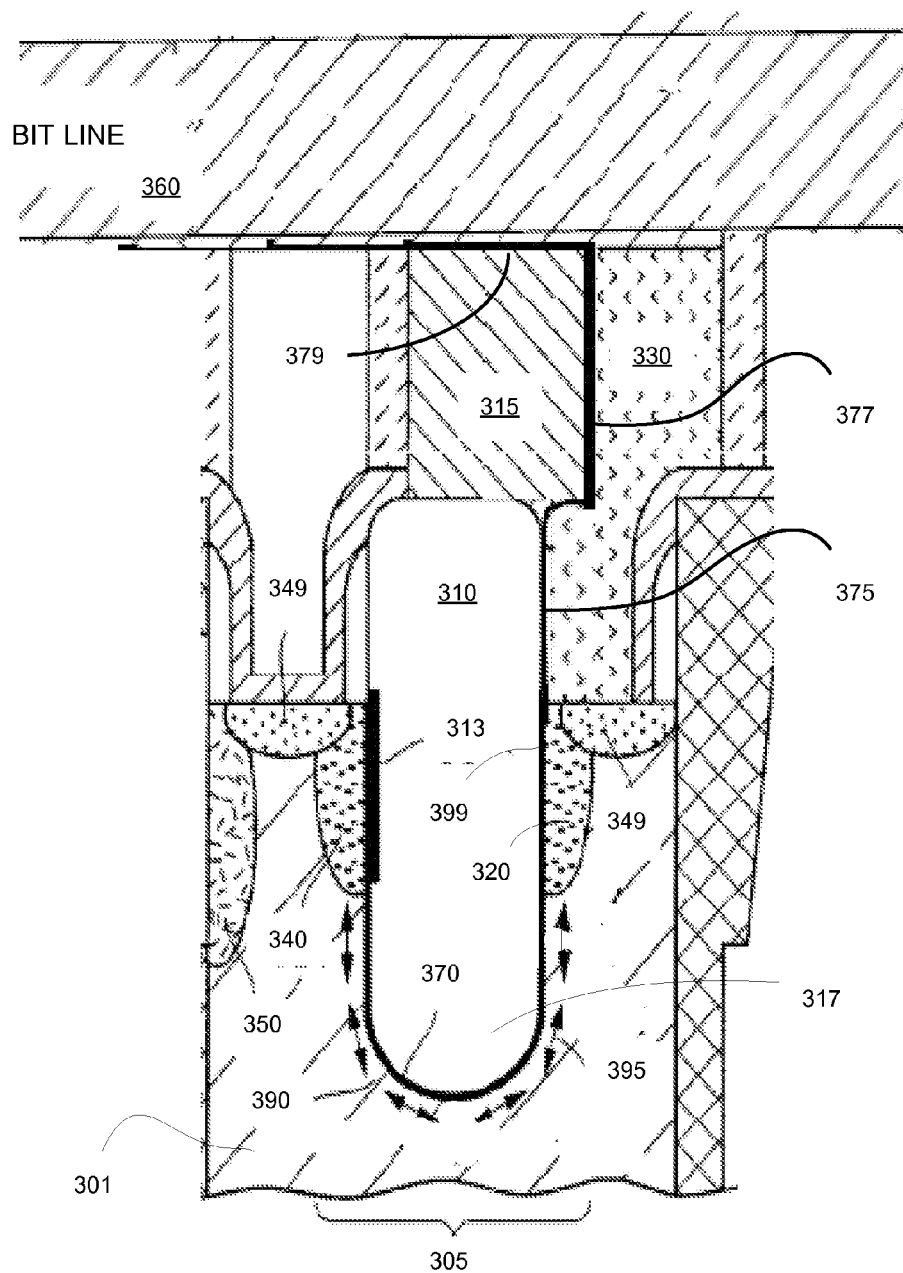
FIG. 3 is a cross-sectional view of a vertically disposed two-terminal floating gate FET having capacitive coupling between a drain region and a floating gate as formed as a recessed channel array transistor, in accordance with one embodiment of the present disclosure.

FIG. 3 is a cross-sectional view of a memory cell array 300, including a vertically disposed two-terminal floating gate FET memory cell 305 having capacitive coupling between a drain region and a floating gate, in accordance with one embodiment of the present disclosure. As such, instead of providing a capacitor extending through the semiconductor substrate for purposes of capacitive coupling to a floating gate 310, embodiments of the present invention are able to utilize and enhance the capacitive coupling between the drain region and/or drain junction of the device 300 and the floating gate 310 in order to control the voltage on the floating gate 310 in a two-terminal memory cell 305.

The floating gate 310 in the memory cell 305 is vertically disposed about a substrate 301. As shown in FIG. 3, floating gate 310 is partially embedded in substrate 301 and also extends above substrate 301. Other embodiments are well suited to configurations where the floating gate 310 is entirely disposed within substrate 310, and in still other embodiments where the floating gate 310 is disposed entirely above substrate 310.

Floating gate 310 includes an upper portion 315 that normally acts as a contact to a word line, using conventional fabrication steps. For instance, upper portion 315 may be a gate contact, or a gate electrode, both of which are electrically coupled to floating gate 310, and/or are extensions of floating gate 310. However, in embodiments of the present invention, gate 310 is not electrically coupled to a voltage source (e.g., via a word line connection), and instead is left floating. As previously described, voltage is placed on the floating gate 310 through capacitive coupling with the drain region 320, and/or through capacitive coupling with the drain junction that includes the drain region 320 and any other feature electrically coupled to the region 320, such as, bit line contact 330.

The memory cell includes a source region 340 and a drain region 320. As shown in FIG. 3, the source and drain regions 340 and 320, respectively, are symmetric about floating gate 310. However, in other embodiments, the source region 340 and the drain region 320 are asymmetric. For instance, drain region 320 may be larger than the source region 340. In one implementation, drain region 320 may extend further into substrate 301 to provide more capacitive coupling between the drain region 320 and the floating gate 310 than the coupling between the source region 320 and floating gate 310.

As shown in FIG. 3, optional source/drain implant portions 349 provide connectivity to the source region 340 and drain region 320. For instance, implant 349 that is electrically coupled to source region 340 is also electrically coupled to an optional buried strap 350. In that manner, a terminal (not shown) coupled to buried strap 350 is able to drive the source region 340 with a voltage. In another embodiment, a voltage source (not shown) is coupled to the optional implant portion 349 that forms a trench extending to the periphery of array 300. In still another embodiment, the voltage source is coupled directly to the source region 340 that forms a trench extending to the periphery of the array 300.

Drain region 320 is electrically coupled to bit line contact 330. A bit line 360 is electrically coupled to the drain region 320 via the bit line contact 330. As shown in FIG. 3, bit line contact 330 may also be coupled to implant portion 349 to provide additional interfacing with the drain region 320.

In addition, gate oxide spacer 370 is formed adjacent to the floating gate 310 in order to provide electrical isolation to the floating gate 310. In part, gate oxide 370 lines portions of the floating gate 310 that are embedded within the substrate 301. For instance, gate oxide 370 is disposed between substrate 301 and bottom portion 317 of floating gate 310. As such, substrate 301 is separated from the floating gate 310. Also, gate oxide 370 is disposed adjacent to the second side 399 of floating gate 310. As such, oxide 370 is disposed between drain region 320 and floating gate 310.

In addition, a gate oxide liner 375 is also formed between the bit line contact 330 and floating gate 310. Oxide liner 375 exhibits a high dielectric constant (k) characteristic. As such, floating gate 310 is electrically isolated from bit line contact 330. However, liner 375 is thin enough to promote capacitive coupling between the bit line contact 330 and the floating gate 310.

In addition, as the bit line contact 330 extends vertically upwards towards the bit line 360, an oxide liner 377 is formed between the contact 330 and the upper portion (e.g., word line contact) 315 of the floating gate 310. Gate oxide liner 377 may be formed using the same processing step or steps used to fabricate gate oxide liner 375 in one embodiment, or may be formed using different fabrication step or steps. In that manner, floating gate 310 and upper portion 315 remain electrically isolated from the bit line contact 330. However, liner 377 is thin enough to promote capacitive coupling between the bit line contact 330 and the upper portion 315 that is electrically coupled to the floating gate 310.

Further, a high dielectric constant (k) oxide liner 379 is formed between the upper portion 315 of floating gate 310 and the bit line 360. In that manner, bit line 360 is electrically isolated from the upper portion 315 of floating gate 310. However, liner 379 is thin enough to promote capacitive coupling between the bit line contact 330 and upper portion 310 of floating gate 310.

As shown in FIG. 3, an effective drain junction is shown for the non-volatile memory device 300. The drain junction includes the drain region 320, the drain extension 225, the bit line contact 330, and portions of the bit line 260. The effective drain is defined as those features in the non-volatile memory device that are configured for capacitive coupling with the floating gate 310.

In one embodiment, in addition to the gate oxide 370, a spacer oxide 313 is further disposed between the floating gate 310 and source region 340. In that manner, spacer oxide 313 provides additional electrical shielding between the floating gate 310 and the source region 340. As such, the capacitive coupling between the source region 340 and the floating gate is reduced. Also, the spacer oxide is not present between the floating gate 310 and the drain region 320, and as such is not symmetric within the memory device 300. In one embodiment, the capacitive coupling between the drain region 320 and the floating gate 310 is greater than any potential capacitive coupling between the source region 340 and the floating gate 310.

During operation, a channel 390 couples the source region 340 and the drain region 320. In that manner, current flow 395 is manipulated in the channel region 390 for purposes of injecting electrons into the floating gate 310, removing electrons from the floating gate 310, or for purposes of performing a read operation on the semiconductor device 300 as influenced by the charge on the floating gate 310. In one embodiment, channel 390 is doped with p-type impurities, and source region 340 and drain region 320 are doped with n-type impurities, such that the two terminal non-volatile memory device 300 is an n-channel transistor. In other embodiments, channel 390 is doped with n-type impurities, and the source region 340 and drain region 320 are doped with p-type impurities, such that the two terminal non-volatile memory device 300 is a p-channel transistor.

Figure 4:
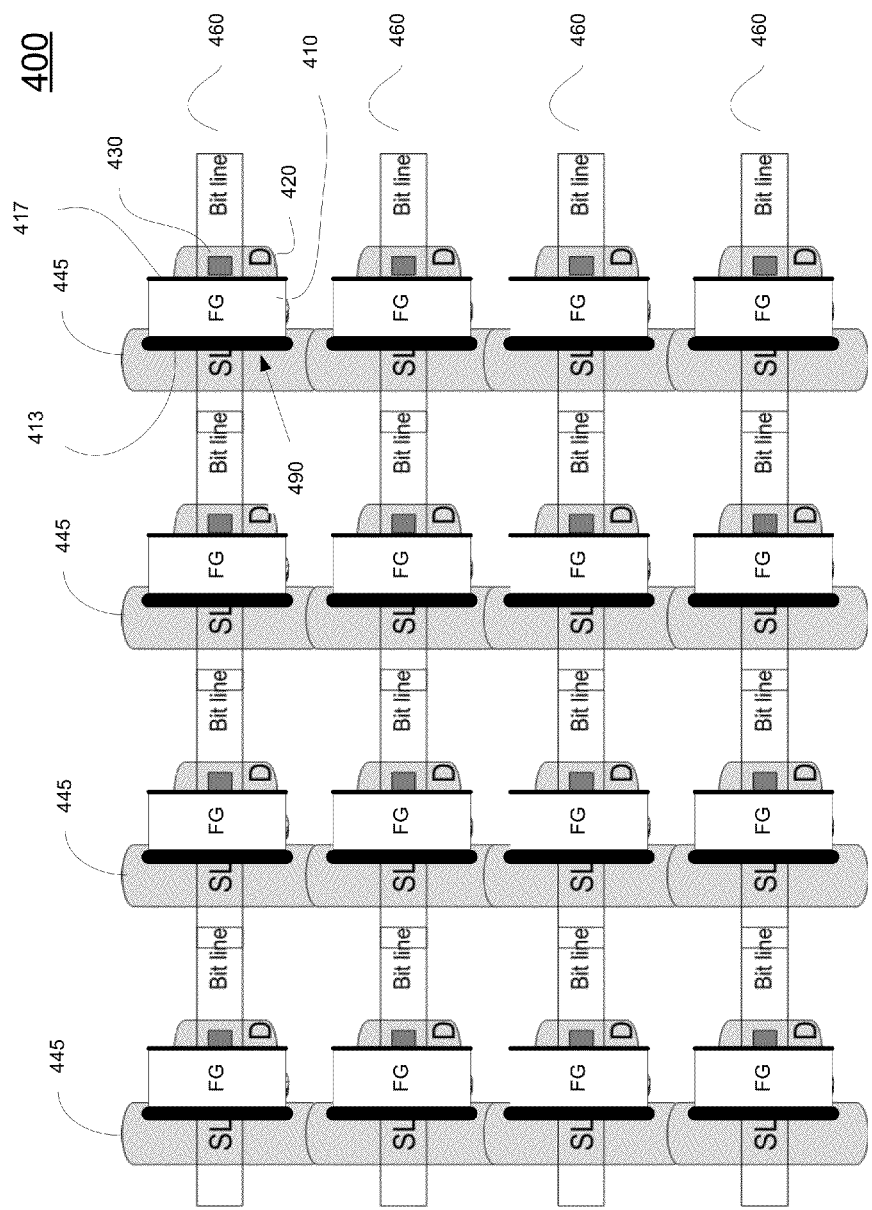
FIG. 4 is a top view of an array of two terminal floating gate FETs having capacitive coupling between a drain region and a floating gate, in accordance with one embodiment of the present disclosure.

FIG. 4 is a top view of an array 400 of two terminal floating gate FETs having capacitive coupling between a drain region and a floating gate, in accordance with one embodiment of the present disclosure. The array 400 may be comprised of two terminal memory devices 200 of FIG. 2, of memory device 300 of FIG. 3, and/or memory devices 600A and 600B of FIGS. 6A and 6B, in embodiments of the present invention. For instance, memory device 490 in array 400 is representative of the memory devices in the array 400. In one embodiment, device 490 includes a recessed channel floating gate 410 that is partially embedded in a substrate (not shown), wherein the floating gate comprises a first side, a second side, and a bottom portion. A source region (hidden) is coupled to a first terminal, and is formed adjacent to the first side of the floating gate 410. A drain region 420 is coupled to a second terminal (not shown) and is formed adjacent to the second side of the floating gate 410. The drain region 420 is electrically coupled to one of the bit lines 460 via a corresponding bit line contact 430. Also, during operation of the memory device, a channel is coupled the source and drain regions.

In embodiments, in representative memory device 490, the drain region 420 is capacitively coupled to the floating gate 410. That is, the drain region 420, and/or features coupled to the drain region 420 and forming a drain junction, overlaps a sufficient portion of the floating gate 410, such that a programming voltage for the device that is applied to the second terminal of the drain region 420 can be imparted to the floating gate 410 through capacitive coupling. To facilitate the capacitive coupling, a thin oxide 417, having a high dielectric constant (k) is disposed between the floating gate and the drain region 420. Additionally, the thin oxide 417 may be disposed between the floating gate and any feature electrically coupled to the drain region, all of which comprise the drain junction (e.g., drain region, bit contact, portions of the bit line, etc.). In still another embodiment, the drain region extends further into the substrate than a corresponding source region, and as such the drain region is exposed to more of the floating gate in comparison to the source region. That is, an overlap between the drain region 420 to floating gate 410 is greater than an overlap between the source region 240 to floating gate 210.

A plurality of bit lines 460 is provided, each of which is oriented in a first direction. As shown in FIG. 4, in each memory cell, a bit line contact 430 provides electrical coupling between a corresponding bit line 460 and a drain region 420, or corresponding drain junction, previously described. In some embodiments, the drain region 420 is coupled to a corresponding bit line 460 via bit line contact 430 and a drain implant (e.g., implant 220). Bit lines are electrically isolated from the underlying active regions of corresponding memory devices.

At least one source line 445 is provided in the array 400. The source line 445 is oriented in a second direction that is orthogonal to the first direction. As such, the direction of the at least one source line 445 is orthogonal to the direction of the bit lines 460. In one embodiment, the source line 445 is coupled to a buried strap (not shown) that is also electrically coupled to the source regions of corresponding memory devices. In another embodiment, the source line 445 is coupled directly to the source regions of corresponding memory devices through an implant portion. In still another embodiment, the source line comprises the source regions of corresponding memory devices.

In one embodiment, a spacer oxide 413 is further disposed between the floating gate 410 and source region (hidden), and/or source line 445 to provide electrical shielding. As shown in FIG. 4, the thickness of the spacer oxide 413 is greater than the thickness of the thin oxide 417, separating the floating gate 410 and the drain region 420. As such, the capacitive coupling between the drain region 420 and the floating gate 410 is greater than any potential capacitive coupling between the source region and/or source line 445 and the floating gate 410.

Figure 5:
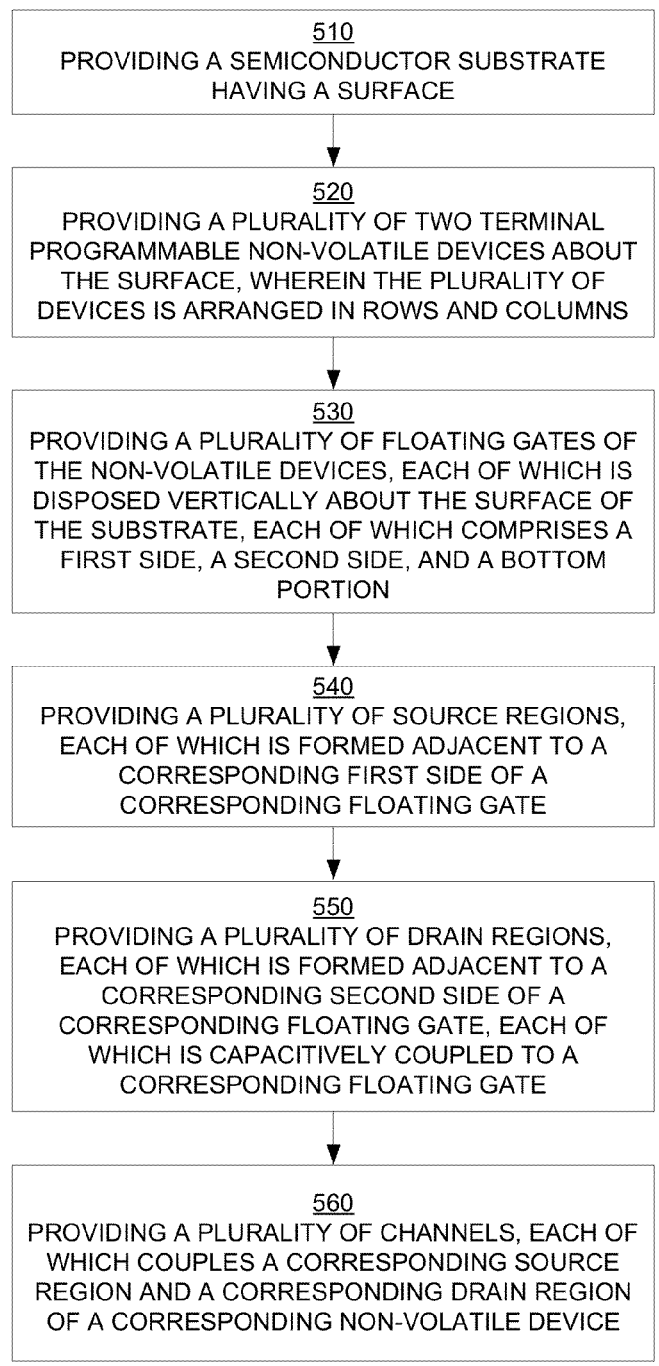
FIG. 5 is a flow chart illustrating a method of forming an array of two terminal floating gate FETs having capacitive coupling between a drain region and a floating gate, in accordance with one embodiment of the present disclosure.

FIG. 5 is a flow chart 500 of a method of forming an array of two terminal floating gate FETs having capacitive coupling between a drain region and a floating gate, in accordance with one embodiment of the present invention. For instance, flow chart 500 may be implemented to fabricate array 400 shown in FIG. 4, in one embodiment.

At 510, a semiconductor substrate is provided. The substrate includes a surface about which non-volatile memory devices are formed. Specifically, at 520, a plurality of two terminal programmable non-volatile devices are formed about the surface. For instance, vertically structured memory devices are formed about the surface. In some embodiments, floating gates of memory devices in the array are configured as RCAT devices. In other embodiments, floating gates of memory devices in the array are configured as FinFET devices. Still other embodiments support any configuration of vertically structured floating gate memory devices.

At 530, a plurality of floating gates of the non-volatile devices are provided. As previously described, the floating gates are disposed vertically about the surface of the substrate. Moreover, the floating gates each comprises a first side, a second side, and a bottom portion. For instance, in one embodiment, each of the floating gates is formed as a recessed channel in an RCAT formation, wherein the sides and bottom portion define a trench, or portions of a trench that is used, in part, to fabricate the floating gate in and/or about the surface of the substrate. That is, the floating gate is partially embedded in the substrate. In another embodiment, the floating gates and memory devices are formed as a fin structure (e.g., FinFET) above the surface of the substrate.

At 540, a plurality of source regions is provided. Each of the source regions is formed adjacent to a corresponding first side of a corresponding floating gate. In addition, at 550, a plurality of drain regions is provided. Each of the drain regions is formed adjacent to a corresponding second side of a corresponding floating gate. In one embodiment, the drain and source regions are symmetrically formed about the floating gate. In other embodiments, the drain and source regions are asymmetrically formed about the floating gate, as previously described. A plurality of channels is provided, each of which couples corresponding drain and source regions of a corresponding programmable non-volatile memory device.

In one embodiment, the channel is an n-type channel, and the device includes p-type drain and source regions. In another embodiment, the channel is a p-type channel, and the device includes n-type drain and source regions.

Distinctively, in each of the memory devices, the drain region is capacitively coupled to the floating gate. That is, the drain region overlaps a sufficient portion of the corresponding floating gate. More particularly, in each of the memory devices, a thin oxide having a high dielectric constant (k) is formed between the drain region and the floating gate. The thin oxide facilitates electrical isolation between the drain region and floating gate, and also promotes capacitive coupling between the two features. In that manner, any programming voltage that is applied to a terminal of a corresponding drain of the memory device is also placed on the corresponding drain region, and in part, is imparted to the floating gate through capacitive coupling.

In embodiments, the capacitive coupling is achieved through any feature that is electrically coupled to the drain region. That is, a drain junction comprises the drain region and one or more features electrically coupled to the drain region and that also are adjacent to the floating gate. For instance, the drain junction includes the drain region, the bit line contact, drain implants, and portions of the bit line. More particularly, in each of the memory devices, a thin oxide having a high dielectric constant (k) is formed between the features of the drain junction and the floating gate. The thin oxide facilitates electrical isolation between the drain junction and floating gate, and also promotes capacitive coupling between the two features. In that manner, any programming voltage applied to a terminal is reflected throughout the drain junction, and is, in part, imparted to the floating gate through capacitive coupling. As an example, in a memory device, a bit line contact may be configured such that the bit line contact is capacitively coupled to a corresponding floating gate. As another example, in a memory device, a corresponding portion of the bit line (e.g., that adjacent to an upper portion of the floating gate or gate contact) is configured such that the bit line is capacitively coupled to a corresponding floating gate.

Moreover, the plurality of two terminal programmable non-volatile devices is arranged and/or configured into rows and columns. The direction of the rows and the direction of the columns are approximately orthogonal to each other. In particular, a plurality of primary bit lines is provided and oriented in first direction. That is, each of the primary bit lines is oriented in the first direction. A plurality of bit line contacts is also provided, wherein one or more drain regions of non-volatile devices that are arranged in a column of the array are also coupled to a corresponding primary bit line via one or more bit line contacts. Additionally, a plurality of secondary bit lines is provided and oriented in a second direction that is orthogonal to the first direction. That is, each of the secondary bit lines is oriented in the second direction. In one embodiment, the source regions of non-volatile memory devices that are arranged in a row of the array comprises a corresponding secondary bit line. In another embodiment, the source regions of non volatile memory devices arranged in a row are coupled to a corresponding secondary bit line (e.g., through bit line contacts, through doping implants, etc.).

In still another embodiment, a plurality of sense amplifiers are coupled to the plurality of secondary bit lines. In other embodiments, instead of sense amplifiers, any means suitable for measuring current or voltage is coupled to the plurality of secondary bit lines. The sense amplifier and/or measuring means are used for purposes of measuring current or voltage when performing programming, erase, and read operations on the array.

FIG. 6A is a blown up view of a two-terminal floating gate FinFET 600A having capacitive coupling between a drain region and a floating gate, wherein the conducting channel is implemented through a vertical fin structure, in accordance with one embodiment of the present disclosure. For instance, in one implementation, the array 400 may be comprised of one or more two terminal floating gate FinFET 600A structures. FinFET 600A is intended to be representative of various nonplanar transistor technologies, and as such, for purposes of clarity and illustration only features pertinent to embodiments of the present invention are discussed.

As shown in FIG. 6A, the FinFET 600A is a nonplanar, floating gate transistor that is built on a substrate. In one implementation, the FinFET 600A is built on a silicon on insulator (SOI) substrate. In other implementations, FinFet 600A is configured as an RCAT structure, or any other suitable vertically disposed structure. The FinFET 600 includes a source region/terminal 610 and a drain region/terminal 615. A channel 620 is formed as a vertical fin between the source region 610 and drain region 615. A source extension/contact 611 is formed to facilitate electrical coupling between the source region/terminal 610 and the fin channel 620. Also, a drain/extension contact 616 is formed to facilitate electrical coupling between the drain region 615 and the fin channel 620. FinFET 600A includes a gate insulator 625 that wraps around the fin channel 620. A gate oxide/electrode 630 is formed over the surface of the gate insulator 625. As shown the gate oxide/electrode 630 wraps the fin channel 620, with the insulator 625 disposed therebetween. In some embodiments, two gate oxide/electrodes 630 are formed, each on either side of the fin channel 620. The gate oxide/electrode 630 forms the gate of the FinFET 600A.

Also shown in FIG. 6A, an insulator 640 separates the gate oxide/electrode 630 from the source region/terminal 610. Additionally, insulator 645 separates the gate oxide/electrode 630s from the drain region/terminal 615. In particular, the insulator 645 separating the gate oxide/electrodes 630 from the drain region/terminal 615 is thinner than insulator 640 that separates the gate oxide/electrode 630 from the source region/terminal 610. As such, the insulator 640 provides more electrical shielding between the floating gate oxide/electrode 630 and the source region/terminal 610 than that provided by insulator 645 between the gate oxide/electrode 630 and the drain region/terminal 615. In that manner, the capacitive coupling between the source region/terminal 610 and the gate oxide/electrode 630 is reduced. In one embodiment, the capacitive coupling between the drain region/terminal 615 and the gate oxide/electrode 630 is greater than any potential capacitive coupling between the source region/terminal 610 and the gate oxide/electrode 630.

Figure 6B:
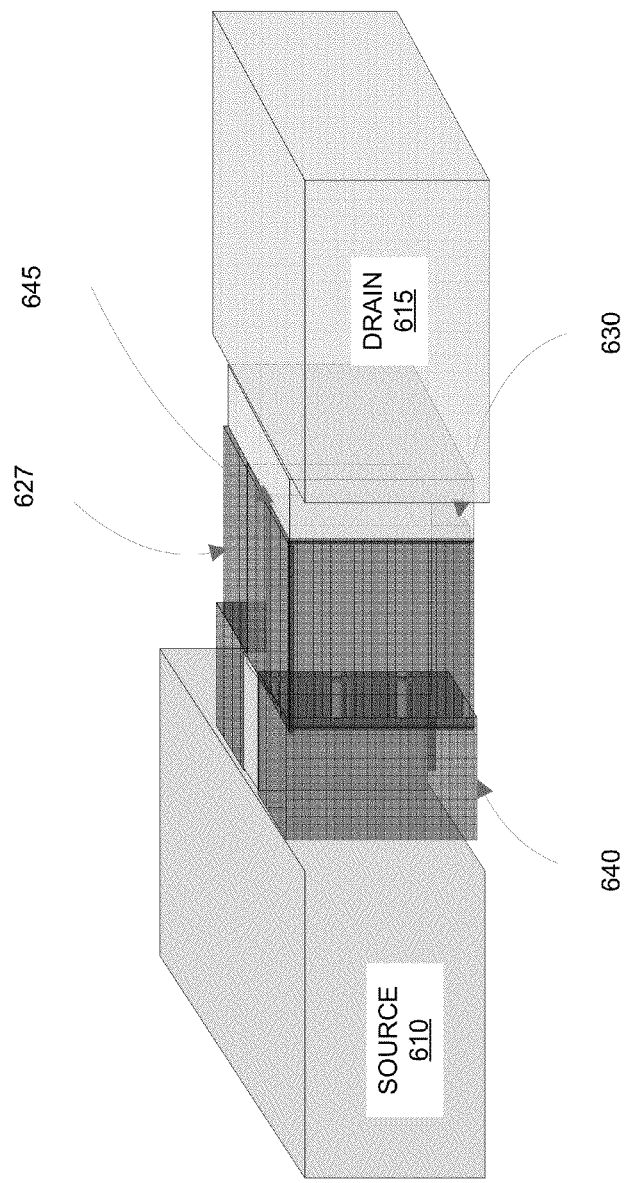
FIG. 6B is a perspective view of the two-terminal floating gate FinFET of FIG. 6A having capacitive coupling between a drain region and a floating gate, in accordance with one embodiment of the present disclosure.

FIG. 6B is a perspective view of a two-terminal floating gate FinFET 600B, in accordance with one embodiment of the present disclosure. In one embodiment, FinFET 600B is the FinFET 600A of FIG. 6A having capacitive coupling between a drain region and a floating gate, in accordance with one embodiment of the present disclosure. As shown in FIG. 6B, a source region/terminal 610 and drain region/terminal 615 are separated by a fin channel (hidden). One or more gate electrodes 630 surrounds the fin channel and provides at least one surface for the desired capacitive coupling between the drain region/terminal 615 and the gate oxide/electrodes 630. For instance, a thin insulator 645 is formed between the drain region/terminal 615 and the corresponding gate oxide/electrode 630 to facilitate capacitive coupling. Also, a thicker insulator 640 is formed between the source region/terminal 610 and the corresponding gate oxide/electrode 630 to reduce any capacitive coupling. In addition, an insulator 627 is formed over the gate oxide/electrode 630, in one embodiment.

Figure 7:
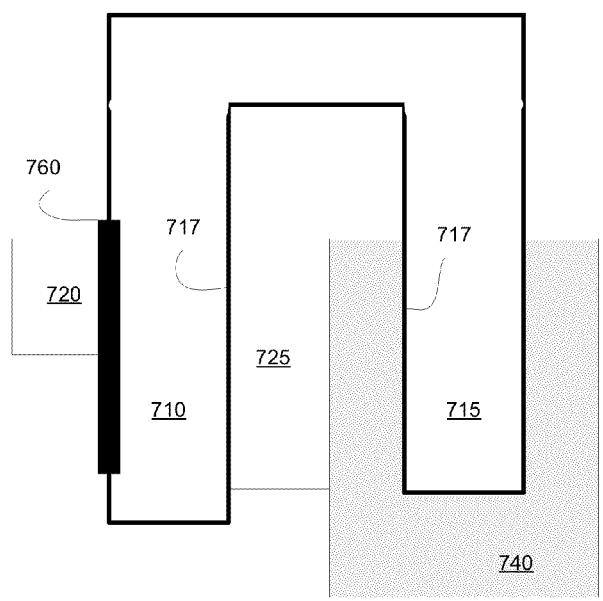
FIG. 7 is a cross-sectional view of a vertically configured floating gate transistor capacitively coupled to a laterally positioned n-doped region, in accordance with one embodiment of the present disclosure.

FIG. 7 is a cross-sectional view of a vertically configured memory cell 700 including a floating gate memory transistor capacitively coupled to a laterally positioned n-doped region, such as an actively doped N+ region or n-well, wherein a vertically constructed coupling capacitor is used to increase capacitive coupling between the drain and gate in accordance with one embodiment of the present disclosure. The vertically configured floating gate memory cell 700 is implemented in the configurations of memory array 400 in embodiments. That is, memory cells of both a planar configuration as well as a vertical configuration are implementable within memory array 400.

In one embodiment, the floating gate memory cell 700 is configured as a recessed channel array transistor (RCAT), and is partially embedded in the substrate 750. In that manner, memory cell 700 is configured as a vertical structure. While FIG. 7 depicts the non-volatile memory in a RCAT configuration, it will be apparent to those skilled in the art that other vertical structures can be used. Thus, embodiments of the present invention can be used in multi-gate (FinFET type) orientations, or in any configuration wherein the floating gate is oriented vertically with respect to the substrate 750.

As shown in FIG. 7, a source region 720 and a drain region 725 are formed adjacent to a floating gate 710 of the memory transistor. A channel region is located under the floating gate 710 coupling the source region 720 and the drain region 725.

In one embodiment, the spacing between the source region 720 and the floating gate 710 is increased to reduce capacitive coupling. For instance, a thick oxide layer 760 is deposed between the source region 720 and the floating gate 710, and is of a thickness necessary to reduce or eliminate capacitive coupling between the source region 720 and the floating gate 710. In addition, the depth of the source region 720 into the substrate is less than the depth of the drain region 725 into the substrate, such that an overlap between the drain region 725 and the floating gate 710 is greater than an overlap between the source region 720 and the floating gate 710. Also, a thin oxide layer 717 is disposed between the drain region 725 and the floating gate 710. For instance, the thin oxide 717 is disposed between the drain region 725 and floating gate 710, as well as between the floating gate extension 715 and the n-doped region 740. As shown, the thin oxide surrounds the floating gate 710 except for areas where the thick oxide 760 is disposed.

In addition, the floating gate 710 is not electrically connected to a voltage source, but a voltage is applied to the gate 710 through capacitive coupling to the drain region 725 or the n-doped region 740. More particularly, the floating gate 710 is capacitively coupled to an n-doped region 740 doped with n-type dopants, such as an actively doped N+ region or n-well, at least portions of which are located laterally from the memory transistor. In one embodiment, the n-doped region 740 is common to one or more memory cells.

The floating gate 710 extends beyond the channel region of the memory transistor in cell 700. For instance, the floating gate 710 includes and/or is electrically coupled to a gate extension/contact 715 that is disposed laterally from the memory transistor including source region 720 and drain region 725 and floating gate 710. More particularly, the gate extension/contact 715 overlaps a buried n-doped region 740, and is electrically isolated by the thin oxide 717 layer. In that manner, the gate extension/contact 715 and by extension the floating gate 710 are capacitively coupled to the n-doped region 740. As such, any voltage applied to the n-doped region 740 is applied through capacitive coupling to the floating gate 710.

The floating gate memory cell is a two-terminal device, in that voltages are applied to the source region 720 through an appropriate source terminal. In addition, voltages may be applied to either the drain region 725 through an appropriate drain terminal, or to the n-doped region 740 through an appropriate terminal. Because the drain region 725 and the n-doped region 740 are composed of materials with similar characteristics (e.g., n-type dopants), the two regions are electrically coupled. In that manner, any voltage applied to the drain region 725 is also applied to the n-doped region 740, and similar, any voltage applied to the n-doped region 740 is applied to the drain region 725. As such, any voltage applied either to the drain region 725 and/or the n-doped region 740 is also applied to the floating gate 710 through capacitive coupling between the drain region 725 and floating gate 710 as well as through capacitive coupling between the n-doped region 740 and the floating gate extension/contact 715.

Figure 8:
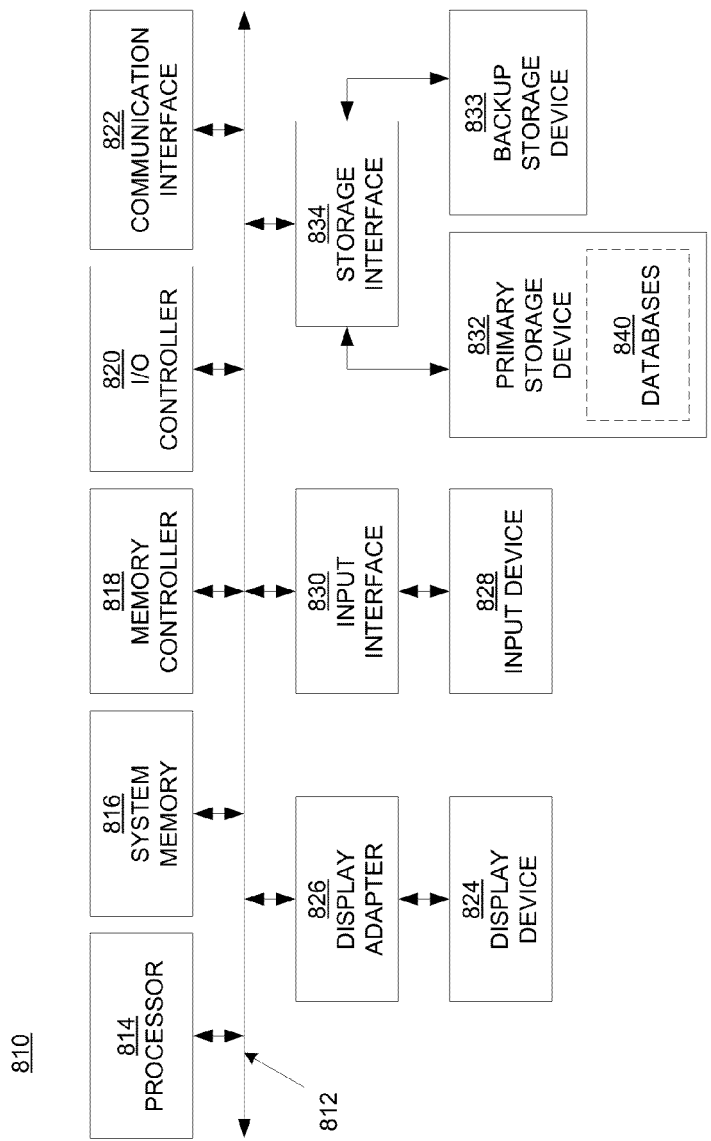
FIG. 8 depicts a block diagram of an exemplary computer system suitable for implementing the present methods and systems, in accordance with one embodiment of the invention.

FIG. 8 is a block diagram of an exemplary computing system 810 capable of implementing embodiments of the present disclosure. Computing system 810 broadly represents any single or multi-processor computing device or system capable of executing computer-readable instructions, and including packaged components (e.g., processor 814, memory 816, memory controller 818, etc.) having a capacitance layer configured to provide a filtered power supply. Examples of computing system 810 include, without limitation, workstations, laptops, client-side terminals, servers, distributed computing systems, handheld devices, or any other computing system or device. In its most basic configuration, computing system 810 may include at least one processor 814 and a system memory 816.

Processor 814 generally represents any type or form of processing unit capable of processing data or interpreting and executing instructions. In certain embodiments, processor 814 may receive instructions from a software application or module. These instructions may cause processor 814 to perform the functions of one or more of the example embodiments described and/or illustrated herein. For example, processor 814 may perform and/or be a means for performing, either alone or in combination with other elements, one or more of the identifying, determining, using, implementing, translating, tracking, receiving, moving, and providing described herein. Processor 814 may also perform and/or be a means for performing any other steps, methods, or processes described and/or illustrated herein.

System memory 816 generally represents any type or form of volatile or non-volatile storage device or medium capable of storing data and/or other computer-readable instructions. Additionally, memory 816 may be representative of a stack of memory chips within one or more packaged devices. Examples of system memory 816 include, without limitation, RAM, DRAM, ROM, flash memory, or any other suitable memory device. Although not required, in certain embodiments computing system 810 may include both a volatile memory unit (such as, for example, system memory 816) and a non-volatile storage device (such as, for example, primary storage device 832). Memory devices in system memory 816 may include one or more of the two-terminal non-volatile memory devices 200, 300, 600A and 600B, as well as the array 400.

Computing system 810 may also include one or more components or elements in addition to processor 814 and system memory 816. For example, in the embodiment of FIG. 8, computing system 810 includes a memory controller 818, an input/output (I/O) controller 820, and a communication interface 822, each of which may be interconnected via a communication infrastructure 812. Communication infrastructure 812 generally represents any type or form of infrastructure capable of facilitating communication between one or more components of a computing device. Examples of communication infrastructure 812 include, without limitation, a communication bus (such as an Industry Standard Architecture (ISA), Peripheral Component Interconnect (PCI), PCI Express (PCIe), or similar bus) and a network.

Memory controller 818 generally represents any type or form of device capable of handling memory or data or controlling communication between one or more components of computing system 810. For example, memory controller 818 may control communication between processor 814, system memory 816, and I/O controller 820 via communication infrastructure 812. Memory controller may perform and/or be a means for performing, either alone or in combination with other elements, one or more of the operations or features described herein.

I/O controller 820 generally represents any type or form of module capable of coordinating and/or controlling the input and output functions of a computing device. For example, I/O controller 820 may control or facilitate transfer of data between one or more elements of computing system 810, such as processor 814, system memory 816, communication interface 822, display adapter 826, input interface 830, and storage interface 834. I/O controller 820 may be used, for example, to perform and/or be a means for performing, either alone or in combination with other elements, one or more of the operations described herein. I/O controller 820 may also be used to perform and/or be a means for performing other operations and features set forth in the instant disclosure.

Communication interface 822 broadly represents any type or form of communication device or adapter capable of facilitating communication between example computing system 810 and one or more additional devices. For example, communication interface 822 may facilitate communication between computing system 810 and a private or public network including additional computing systems. Examples of communication interface 822 include, without limitation, a wired network interface (such as a network interface card), a wireless network interface (such as a wireless network interface card), a modem, and any other suitable interface. In one embodiment, communication interface 822 provides a direct connection to a remote server via a direct link to a network, such as the Internet. Communication interface 822 may also indirectly provide such a connection through, for example, a local area network (such as an Ethernet network), a personal area network, a telephone or cable network, a cellular telephone connection, a satellite data connection, or any other suitable connection.

Communication interface 822 may also represent a host adapter configured to facilitate communication between computing system 810 and one or more additional network or storage devices via an external bus or communications channel. Communication interface 822 may also allow computing system 810 to engage in distributed or remote computing. For example, communication interface 822 may receive instructions from a remote device or send instructions to a remote device for execution. Communication interface 822 may perform and/or be a means for performing, either alone or in combination with other elements, one or more of the operations disclosed herein. Communication interface 822 may also be used to perform and/or be a means for performing other operations and features set forth in the instant disclosure.

As illustrated in FIG. 8, computing system 810 may also include at least one display device 824 coupled to communication infrastructure 812 via a display adapter 826. Display device 824 generally represents any type or form of device capable of visually displaying information forwarded by display adapter 826. Similarly, display adapter 826 generally represents any type or form of device configured to forward graphics, text, and other data from communication infrastructure 812 (or from a frame buffer, as known in the art) for display on display device 824.

As illustrated in FIG. 8, computing system 810 may also include at least one input device 828 coupled to communication infrastructure 812 via an input interface 830. Input device 828 generally represents any type or form of input device capable of providing input, either computer- or human-generated, to computing system 810. Examples of input device 828 include, without limitation, a keyboard, a pointing device, a speech recognition device, or any other input device. In one embodiment, input device 828 may perform and/or be a means for performing, either alone or in combination with other elements, one or more of the operations disclosed herein. Input device 828 may also be used to perform and/or be a means for performing other operations and features set forth in the instant disclosure.

As illustrated in FIG. 8, computing system 810 may also include a primary storage device 832 and a backup storage device 833 coupled to communication infrastructure 812 via a storage interface 834. Storage devices 832 and 833 generally represent any type or form of storage device or medium capable of storing data and/or other computer-readable instructions. For example, storage devices 832 and 833 may be a magnetic disk drive (e.g., a so-called hard drive), a floppy disk drive, a magnetic tape drive, an optical disk drive, a flash drive, or the like. Storage interface 834 generally represents any type or form of interface or device for transferring data between storage devices 832 and 833 and other components of computing system 810.

In one example, databases 840 may be stored in primary storage device 832. Databases 840 may represent portions of a single database or computing device or a plurality of databases or computing devices. For example, databases 840 may represent (be stored on) a portion of computing system 810. Alternatively, databases 840 may represent (be stored on) one or more physically separate devices capable of being accessed by a computing device, such as computing system 810.

Continuing with reference to FIG. 8, storage devices 832 and 833 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 832 and 833 may also include other similar structures or devices for allowing computer software, data, or other computer-readable instructions to be loaded into computing system 810. For example, storage devices 832 and 833 may be configured to read and write software, data, or other computer-readable information. Storage devices 832 and 833 may also be a part of computing system 810 or may be separate devices accessed through other interface systems.

Storage devices 832 and 833 may be used to perform, and/or be a means for performing, either alone or in combination with other elements, one or more of the operations disclosed herein. Storage devices 832 and 833 may also be used to perform, and/or be a means for performing, other operations and features set forth in the instant disclosure.

Many other devices or subsystems may be connected to computing system 810. Conversely, all of the components and devices illustrated in FIG. 8 need not be present to practice the embodiments described herein. The devices and subsystems referenced above may also be interconnected in different ways from that shown in FIG. 8. Computing system 810 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 810. All or a portion of the computer program stored on the computer-readable medium may then be stored in system memory 816 and/or various portions of storage devices 832 and 833. When executed by processor 814, a computer program loaded into computing system 810 may cause processor 814 to perform and/or be a means for performing the functions of the example embodiments described and/or illustrated herein. Additionally or alternatively, the example embodiments described and/or illustrated herein may be implemented in firmware and/or hardware. For example, computing system 810 may be configured as an application specific integrated circuit (ASIC) adapted to implement one or more of the embodiments disclosed herein.

Thus, according to embodiments of the present invention, two terminal non-volatile memory devices are disclosed that exploit the vertical drain to gate coupling of vertically disposed devices. These memory devices feature a reduced planar footprint as drain to gate coupling is provided without a dedicated capacitor.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. A two terminal programmable non-volatile device, comprising:
a floating gate disposed vertically about a substrate in a vertical direction, wherein said floating gate comprises a first side oriented in said vertical direction, a second side opposite to said first side and oriented in said vertical direction, and a bottom portion oriented approximately perpendicular to said vertical direction;
a source region coupled to a first terminal and formed adjacent to said first side of said floating gate;
a drain region coupled to a second terminal and formed adjacent to said second side of said floating gate and opposite to said source region; and
a channel coupling said source region and drain region;
wherein said floating gate is laterally disposed between said source region and said drain region;
wherein said drain region is capacitively coupled to said floating gate and wherein said drain region overlaps a sufficient portion of said floating gate such that a programming voltage for said device applied to said second terminal of said drain region can be imparted to said floating gate through capacitive coupling.

2. The device of claim 1, wherein said floating gate comprises:
a recessed channel floating gate that is partially embedded in said substrate.

3. The device of claim 1, wherein said floating gate comprises:
a FinFet structure above said semiconductor substrate.

4. The device of claim 1, wherein said floating gate comprises:
a FinFet structure above and partially embedded into said semiconductor substrate.

5. The device of claim 1, further comprising:
a thin oxide disposed on said second side of said floating gate and formed between said drain region and said floating gate.

6. The device of claim 1, further comprising:
a spacer oxide disposed on said first side of said floating gate.

7. The device of claim 6, wherein said drain region extends further into said substrate than said source region in said vertical direction, such that a first overlap between said drain region and said floating gate is greater than a second overlap between said source region and said floating gate.

8. The device of claim 1, wherein the capacitive coupling between said drain region and said floating gate is greater than the capacitive coupling between said source region and said floating gate.

9. The device of claim 1, wherein said two terminal device comprises a floating gate n-channel transistor.

10. The device of claim 1, wherein said two terminal device comprises a floating gate p-channel transistor.

11. The device of claim 1, further comprising:
a bit line coupled to said drain region via a bit line contact, wherein said bit line contact is capacitively coupled to said floating gate.

12. The device of claim 11, wherein said floating gate further comprises:
a top portion, wherein said bit line is capacitively coupled to said top portion of said floating gate.

13. The device of claim 1, further comprising a vertically disposed capacitor, said capacitor comprising:
an n-doped region electrically coupled to said drain region, a floating gate extension electrically coupled to said floating gate and disposed within said n-doped region; and a thin oxide layer between said n-doped region and said floating gate extension.

14. A memory cell array, comprising:
a plurality of bit lines oriented in a first direction;
a plurality of two terminal programmable non-volatile devices, wherein each of said devices comprise:
a recessed channel floating gate partially embedded in a substrate, wherein said floating gate comprises a first side oriented in a vertical direction, a second side opposite to said first side and oriented in said vertical direction, and a bottom portion oriented approximately perpendicular to said vertical direction;
a source region coupled to a first terminal and formed adjacent to said first side of said floating gate;
a drain region coupled to a second terminal and formed adjacent to said second side of said floating gate and opposite to said source region, wherein said drain region is electrically coupled to one of said bit lines via a bit line contact; and
a channel coupling said source region and drain region, wherein said floating gate is laterally disposed between said source region and said drain region;
wherein said drain region is capacitively coupled to said floating gate and wherein said drain region overlaps a sufficient portion of said floating gate such that a programming voltage for a corresponding non-volatile device applied to said second terminal of said drain region can be imparted to said floating gate through capacitive coupling.

15. The array of claim 14, further comprising:
at least one source line oriented in a second direction orthogonal to said first direction, wherein said at least one source line comprises one or more source regions of non-volatile devices arranged in a row of said array.

16. The array of claim 14, wherein a corresponding non-volatile device further comprises:
a thin oxide disposed on said second side of said floating gate and formed between said drain region and said floating gate.

17. The array of claim 14, wherein in a corresponding non-volatile device said drain region extends further into said substrate in said vertical direction down said second side of said recessed channel floating gate than said source region extends down said first side into said substrate, such that a first overlap between said drain region and said floating gate is greater than a second overlap between said source region and said floating gate.

18. The array of claim 14, wherein in a corresponding non-volatile device said bit line contact is capacitively coupled to said floating gate.

19. The array of claim 14, wherein in a corresponding non-volatile device, said floating gate further comprises:
a top portion, wherein said bit line is capacitively coupled to said top portion of said floating gate.

20. The array of claim 14, wherein a corresponding non-volatile device comprises a floating gate n-channel transistor.

21. The device of claim 14, wherein a corresponding non-volatile device comprises a floating gate p-channel transistor.

22. A method of forming a memory cell array, comprising:
providing a semiconductor substrate having a surface;
providing a plurality of two terminal programmable non-volatile devices about said surface, wherein said plurality of devices is arranged in rows and columns;
providing a plurality of floating gates of said non-volatile devices, each of which is disposed vertically about said surface of said substrate in a vertical direction, each of which comprises a first side oriented in said vertical direction, a second side opposite to said first side and oriented in said vertical direction, and a bottom portion oriented approximately perpendicular to said vertical direction;
providing a plurality of source regions, each of which is formed adjacent to a corresponding first side of a corresponding floating gate;
providing a plurality of drain regions, each of which is formed adjacent to a corresponding second side of a corresponding floating gate and opposite a corresponding source region, each of which is capacitively coupled to a corresponding floating gate, and forming each of said plurality of drain regions such that each drain region overlaps a sufficient portion of a corresponding floating gate such that a programming voltage for a corresponding device applied to terminal of a corresponding drain region can be imparted to said corresponding floating gate through capacitive coupling; and
providing a plurality of channels, each of which couples a corresponding source region and a corresponding drain region of a corresponding non-volatile device, and wherein a corresponding floating gate is laterally disposed between said corresponding source region and said corresponding drain region, wherein said corresponding drain region is capacitively coupled to said corresponding floating gate.

23. The method of claim 22, further comprising:
providing a plurality of primary bit lines oriented in a first direction; and
providing a plurality of bit line contacts, wherein one or more drain regions of non-volatile devices arranged in a column of said array are coupled to a corresponding primary bit line via one or more bit line contacts.

24. The method of claim 23, further comprising:
providing a plurality of secondary bit lines oriented in a second direction orthogonal to said first direction, wherein a secondary bit line comprises one or more source regions of non-volatile devices arranged in a row of said array.

25. The method of claim 24, further comprising:
coupling a plurality of sense amplifiers to said plurality of secondary bit lines for purposes of measuring voltage or current through one or more of said two terminal non-volatile devices.

26. The method of claim 23, further comprising:
configuring a corresponding bit line contact such that said bit line contact is capacitively coupled to a corresponding floating gate.

27. The method of claim 23, further comprising:
configuring a corresponding bit line such that said corresponding bit line is capacitively coupled to a top portion of a corresponding floating gate.

28. The method of claim 22, wherein said providing a plurality of floating gates comprises:
forming each of said plurality of floating gates as a FinFet structure formed above said surface of said substrate.

29. The method of claim 22, wherein said providing a plurality of floating gates comprises:
forming each of said plurality of floating gates as a recessed channel that is partially embedded in said substrate.

30. The method of claim 22, further comprising:
forming a plurality of thin oxides, each of which is disposed on a corresponding second side of a corresponding floating gate, and further formed between a corresponding drain region and said corresponding floating gate.

\* \* \* \* \*